United States Patent
Issa

(10) Patent No.: US 9,905,614 B2
(45) Date of Patent: Feb. 27, 2018

(54) ORGANIC PHOTOVOLTAIC ELEMENT AND METHOD FOR PRODUCING SAME

(71) Applicant: OPVIUS GMBH, Kitzingen (DE)

(72) Inventor: Hafis Hermann Issa, Stuttgart (DE)

(73) Assignee: Opvius GmbH, Kitzingen (DE)

( * ) Notice: Subject to any disclaimer, the term of this patent is extended or adjusted under 35 U.S.C. 154(b) by 0 days.

(21) Appl. No.: 15/185,260

(22) Filed: Jun. 17, 2016

(65) Prior Publication Data

US 2016/0293669 A1    Oct. 6, 2016

Related U.S. Application Data

(63) Continuation of application No. PCT/EP2014/078053, filed on Dec. 16, 2014.

(30) Foreign Application Priority Data

Dec. 17, 2013 (DE) .................. 10 2013 226 280

(51) Int. Cl.
| | | |
|---|---|---|
| *H01L 27/30* | (2006.01) | |
| *H01L 51/00* | (2006.01) | |
| *H01L 31/05* | (2014.01) | |
| *H01L 51/42* | (2006.01) | |

(52) U.S. Cl.
CPC ........ *H01L 27/301* (2013.01); *H01L 31/0504* (2013.01); *H01L 51/0004* (2013.01); *H01L 51/4293* (2013.01); *Y02E 10/549* (2013.01); *Y02P 70/521* (2015.11)

(58) Field of Classification Search
CPC .......................... H01L 27/301; H01L 51/4293
See application file for complete search history.

(56) References Cited

U.S. PATENT DOCUMENTS

| | | | | |
|---|---|---|---|---|
| 4,089,705 | A * | 5/1978 | Rubin | ............... H01L 31/042 |
| | | | | 136/244 |
| 8,129,616 | B2 | 3/2012 | Brabec et al. | |
| 2005/0145274 | A1* | 7/2005 | Polce | ............... H01L 31/048 |
| | | | | 136/244 |
| 2005/0224935 | A1 | 10/2005 | Schaepkens et al. | |
| 2007/0175509 | A1* | 8/2007 | Yagiura | ............... H01L 31/0352 |
| | | | | 136/256 |
| 2010/0028533 | A1 | 2/2010 | Bollman et al. | |
| 2012/0000502 | A1* | 1/2012 | Wiedeman | ............... H01L 31/048 |
| | | | | 136/244 |

(Continued)

FOREIGN PATENT DOCUMENTS

| | | | |
|---|---|---|---|
| CN | 203277409 U | * | 11/2013 |
| DE | 4313572 A1 | | 8/1994 |

(Continued)

OTHER PUBLICATIONS

Lu et al., CN 203277409 U, English Machine Translation, China.*

*Primary Examiner* — Tae-Sik Kang
(74) *Attorney, Agent, or Firm* — Laurence A. Greenberg; Werner H. Stemer; Ralph E. Locher

(57) ABSTRACT

An organic photovoltaic (OPV) element that extends in a longitudinal direction and contains a plurality of modules, each of which includes a number of serially connected cells. A periodic succession of a number of the modules defines a pattern having at least a threefold rotational symmetry. Preferably, the basic shape of the modules is triangular, and the combined modules form a hexagonal superstructure.

13 Claims, 5 Drawing Sheets

(56) References Cited

U.S. PATENT DOCUMENTS

| | | | |
|---|---|---|---|
| 2012/0012152 A1 | 1/2012 | Yagiura et al. | |
| 2012/0031470 A1* | 2/2012 | Dimov | F24J 2/5232 136/251 |
| 2012/0138123 A1* | 6/2012 | Newdoll | F24J 2/461 136/246 |

FOREIGN PATENT DOCUMENTS

| | | |
|---|---|---|
| DE | 102012206111 A1 | 10/2013 |
| EP | 1816684 A2 | 8/2007 |
| JP | 2011114091 A | 6/2011 |

* cited by examiner

ORGANIC PHOTOVOLTAIC ELEMENT AND METHOD FOR PRODUCING SAME

CROSS-REFERENCE TO RELATED APPLICATION

This is a continuation application, under 35 U.S.C. § 120, of copending international application No. PCT/EP2014/078053, filed Dec. 16, 2014, which designated the United States; this application also claims the priority, under 35 U.S.C. § 119, of German patent application No. DE 10 2013 226 280.9, filed Dec. 17, 2013; the prior applications are herewith incorporated by reference in their entireties.

BACKGROUND OF THE INVENTION

Field of the Invention

The invention concerns an organic photovoltaic element, hereinafter called OPV element, which extends in a lengthwise direction, with a plurality of modules, each of them having a number of serially connected cells. The invention also concerns a method for producing such an OPV element.

One such OPV element and a production method can be found, for example, in U.S. Pat. No. 8,129,616 B2.

A preferred field of use of OPV elements is the generation of electrical energy by sunlight. For this, OPV elements have a number of cells produced from an organic semiconductor material, in which free charge carriers are generated by absorption of sunlight. The semiconductor material is typically applied as a thin film on an essentially transparent substrate film. The charge carriers generated in the cells can be picked off through contacts and supplied as current to a consumer. The available current intensity and the voltage provided by the OPV element are dependent, among other things, on the make-up of the OPV element. The current intensity generated by a cell is essentially defined here by the surface covered by the semiconductor material; on the other hand, the voltage is essentially defined by the band gap of the semiconductor material and accordingly is material-dependent. In order to achieve a given voltage and a given current intensity, an OPV element therefore often contains a plurality of cells, which are accordingly connected in parallel and/or in series with each other. Several OPV elements can also be switched together accordingly to form an OPV panel.

It is known from U.S. Pat. No. 8,129,616 B2 to produce OPV elements with a roller pressing machine in a roller pressing process such that the individual cells are fashioned in strip form and oriented along the direction of conveyance of the roller pressing machine used for the production. In this process, a semiconductor material is applied as a number of endless strips onto a substrate film, particularly a transparent one, preferably a plastic film, the endless strips being connected in series orthogonally to the direction of conveyance by additionally applied electrodes. In a region between the endless strips, the electrodes of respectively neighboring cells are connected such that a series circuit is realized. For example, each strip is 2 cm in width and the distance between two neighboring strips is 2 mm. In addition, in the margin region of the OPV element other electrodes are applied in the direction of conveyance for the connection of a consumer. Thanks to the endless production with the roller pressing process, an OPV element can be produced as a web of any given length. The width of the web is limited here by the roller width of the substrate film.

In order to populate a surface extending arbitrarily in two dimensions with OPV elements, several OPV elements, i.e. webs, can be connected to form an overall element, hereinafter also called an OPV panel, for example by overlapping of contacts suitably applied in the margin region of the webs. Since webs of different length typically have different electrical properties, connecting them together is detrimental to the efficiency of the overall element. More suitably, therefore, the webs are subdivided in the direction of conveyance into roughly equal-sized modules with equal electrical properties, so that the electrodes connecting the cells are not applied endlessly, but in sections. This results in particular in an unused section, also called hereafter the dead region, between the end of a first electrode and the beginning of a next electrode in the direction of conveyance. In order to save on material and reduce the ratio of unused to used area, it is advantageous to minimize the dead region by suitable shaping and arranging, as well as suitably adapted interconnecting of the cells.

Furthermore, a stripe pattern defined by the endless strips produces an unwanted visual effect, which in particular adversely affects the perception of the form of the occupied surface.

SUMMARY OF THE INVENTION

The problem which the invention proposes to solve is to indicate an improved and easy to produce OPV element. In particular, the visual perception of an individual OPV element, as well as a plurality of OPV elements arranged to form an OPV panel, should be improved.

For this, it is provided that an OPV element extending in a lengthwise direction contains a plurality of modules. Each of these has a number of serially connected cells. Thanks to a periodic succession of a number of modules, a pattern is defined with at least threefold rotational symmetry. A cell is a smallest electrical unit here. Several cells can be connected together in series and/or in parallel, thereby defining the voltage and current intensity generated by the OPV element. For this, in particular, a number of cells are assembled each time into a module. All modules of an OPV element preferably have the same electrical properties.

In particular, the OPV element contains an organic semiconductor material for the generating of charge carriers, which is deposited as a thin film on a substrate film, especially an essentially transparent one. This then forms a film like layered structure with the semiconductor material and possible other functional layers. The overall OPV element is therefore fashioned as a kind of film. The individual modules are formed within the layered structure by a suitable structuring and electrical interconnection of the layers. All modules of the OPV element are placed together on the individual substrate film. The modules therefore form a repetitive structure on the common substrate film, especially one repeating periodically multiple times. The substrate film and thus also the OPV element are then advantageously package able so that the form of the OPV element can be adapted afterwards.

The cells and the modules containing them also form visual units on account of the absorbing semiconductor layer. In order to achieve an appealing visual impression, the modules and the cells respectively comprised by them are arranged so that the impression of a periodic pattern is produced. By a periodic succession is meant here that a number of modules, especially given the arrangement of the cells contained therein, fills out a two-dimensional surface by being placed alongside each other so that a highly symmetrical, here at least threefold rotationally symmetrical pattern results. By threefold rotational symmetry is meant here that the pattern and advantageously also an individual module is mapped onto itself by threefold rotation about a suitable pivot point each time. In this way, the original direction of conveyance of the roller pressing machine is less obvious, so that a homogeneous visual impression arises. Thanks to the threefold rotational symmetry, greater design freedom is created in the interconnecting of individual OPV elements into higher-order OPV panels. Therefore, thanks to the threefold symmetry, the strip like optics of previous OPV elements are avoided and large, variably configurable surface areas can be produced.

The OPV element can advantageously be produced in a roller pressing process, especially on account of the periodicity of the pattern. In this way, OPV elements of any given length can be fabricated. In order to also form surfaces of any given width, several OPV elements can be used alongside each other. Unwanted visual effects are avoided here thanks to the high symmetry of the pattern. Basically, the use of at least threefold modules in particular makes it possible to assemble a variable, large-area OPV panel with improved appearance as compared to strip patterns, and at the same time this is combined with the possibility of an economical endless production, especially by a roller pressing process. It is also of special importance here that the arranging of the modules alongside each other provides a periodic endless pattern, which can be configured into almost any desired surface.

In one advantageous embodiment, each of the modules is polygonal. This enables, in particular, a good surface utilization. Suitably each of the modules is triangular. This enables a highly symmetrical pattern with especially good surface utilization to be generated. The periodicity of the pattern is advantageously defined here by a rhombus formed by two modules with a common triangle side and the rhombus has mirror symmetry along the triangle side in regard to the arrangement of the cells comprised by it. For example, each module has the form of an equilateral triangle. By mirroring the triangle at one of its base sides, one gets a rhombus, with which a two-dimensional surface can be filled out seamlessly by arranging several rhombi alongside each other. A hexagon formed by three rhombi can likewise be used for this. Thanks to this choice, a high geometrical fill factor is achieved, that is, a large ratio of surface occupied by cells to the total surface.

In another advantageous embodiment, each of the modules contains a number of sub modules, which are interconnected by a number of connection electrodes. Each of the sub modules contains a number of cells. Usually two poles for each cell are provided for the mutual contacting of the cells. While a number of cells can be mutually interconnected by direct contacting of the corresponding poles to form sub modules, it may however be necessary on account of the chosen arrangement of the cells to provide additional connection electrodes in order to electrically connect several sub modules whose contact poles are not directly connected.

In one preferred modification, each of the sub modules is trapezoidal and contains in each case two first base sides. A trapezoidal shape enables the organizing of the visual structure of an in particular triangular module so that it has a threefold rotational symmetry. In particular, each module has precisely three trapezoidal sub modules.

Further preferably each cell is trapezoidal and has two second base sides, each being parallel to the first base sides of the sub module containing the respective cell. In this embodiment, several cells are trapezoidal, that is, formed as strips with beveled ends. Several such strips are arranged alongside each other to form a sub module such that this is likewise trapezoidal. In the case of an equilateral triangle module, three similar trapezoidal sub modules can be arranged such that the sub modules reproduce the triangle. The triangle then has a threefold rotational symmetry, the midpoint of the triangle being a corresponding point of symmetry.

Advantageously, each of the cells defines in each case a surface and the surfaces differ by less than 10%. In this way, in particular, the electrical properties of all cells are similar, so that a power drop from interconnecting the cells can be avoided.

In one preferred embodiment, each cell has a cell height and the cell heights differ by less than 100%, preferably less than 30%. In the case of trapezoidal cells of a trapezoidal sub module, the visual impression is improved by cells with similar cell height, that is, similar spacing of the two base sides of the trapezium. But since the cells here are not the same width and advantageously have the same area as far as possible, a maximum difference of 100% is provided, that is, the largest cell height is at most twice the size of the smallest cell height. Preferably, however, the difference is at most 30%.

In one advantageous modification, the OPV element is formed as an endless web (endless film) extending in the lengthwise direction with a number of contact bars extending in the lengthwise direction. By endless web is meant here that the maximum length in the lengthwise direction is not defined by the arrangement of the cells and the modules, but rather for example by the maximum available length of the substrate material. The contact bars run in the lengthwise direction and are typically parallel to each other.

In one preferred modification, each module has a minus pole and a plus pole and the contact bars in each case connect either a number of minus poles or a number of plus poles. For example, the contact bars are made from an electrically conductive material and connect a plurality of modules such that the charge carriers generated by the OPV element can be collected and picked off via the contact bars. Each contact bar connects either exclusively plus poles or exclusively minus poles, so that contact bars of both polarities are present. Several contact bars of the same polarity can furthermore be interconnected, so that the overall electric power of the OPV element is available across a single pair of poles. In particular, a consumer can be electrically connected in this way to the OPV element across the pair of poles.

In a roller pressing process, the endless web on which the different layers to form the OPV element are applied changes direction several times during the manufacturing process. It is a problem here that the layers applied, especially the semiconductor material applied, must not be subjected to mechanical stress. Now, in an advisable embodiment, it is provided that the contact bars are additionally fashioned as mechanically loadable contact points for deflection rollers of a roller pressing machine in the context of the roller pressing process.

In this way, a damaging of the semiconductor layers, for example, is avoided. Advisedly, the contact bars are made from a mechanically loadable material, fashioned for example as a metal strip, or also as a stranded conductor, and applied as prefabricated conductor strips. For example, the contact bars are adhesively bonded on.

In one preferred embodiment, all modules are connected in parallel. Therefore, the voltage generated by a module also dictates the voltage of the overall OPV element. Thanks to the parallel circuit, the current intensity is maximized. In one advantageous modification, all cells of a module are connected in series. Thanks to the choice of a suitable number of cells connected in series, in particular the voltage of the module and, in connection with exclusively parallel-switched modules, the voltage of the entire OPV element can thus be defined. Suitably, it is also possible in this way to arbitrarily dictate the length of the OPV element along edges defined by the modules. Thanks to the chosen interconnection, OPV elements of different length provide the same voltage. Thanks to the choice of a suitable module form, such as a triangle or hexagon shape, surfaces of any desired shape can be substantially fully occupied in this way by one or more OPV elements.

The OPV element in particular has a layered structure and a substrate film, the layered structure being formed by a roller pressing process. The substrate film is in particular formed as a single piece and the functional layers needed to fashion the OPV element are correspondingly applied thereon and the resulting cells and modules are suitably interconnected. This can be done especially cost-effectively and with high production rate in a roller pressing process. The individual cells are in particular arranged alongside each other in two dimensions regarding the surface defined by the substrate film and electrically interconnected by corresponding contacts. In one suitable variant, several OPV elements are also applied together onto a correspondingly dimensioned substrate film, but in particular not necessarily electrically interconnected.

In order to form an OPV panel, several OPV elements are preferably arranged alongside each other. Thus, the OPV elements are oriented in parallel with each other in regard to their respective lengthwise direction. In particular in the case of contact bars running in the lengthwise direction, this makes possible the occupation of any given surfaces by a number of OPV elements and the collective picking-off of the generated charge carriers.

The benefits achieved with the invention consist in particular in that the OPV element can be produced as a web in a roller pressing or roller application process. In this case, a substrate film is led or conveyed across a number of deflection rollers through a roller pressing machine and processed in a number of process steps. In particular, at least one function layer, such as a semiconductor layer, as well as electrodes are applied or pressed on. Furthermore, the different layers are structured in one or more additional process steps. In this way, functional regions such as electrodes or the cells of the OPV element are configured as desired. Preferably, a laser is used for the structuring, making possible a high precision during the structuring and thus a high fill factor. Preferably a free form laser is used, which in particular can be actuated and moved independently of the conveying movement of the roller pressing machine. In particular, the free form laser can move transversely to the direction of conveyance and thus transversely to the lengthwise direction. In this way, a high flexibility is achieved in the configuring of the pattern and in the formation of the electrodes and thus the interconnecting of the cells and modules.

The width of an OPV element produced in a roller pressing or roller application process, that is, a web, is dictated by the roller width of the substrate film, and the length by the available unwinding length. Advantageously, the contact bars extend in the direction of conveyance of the roller pressing machine and can in this way serve at the same time as contact points of its deflection rollers.

Another benefit is that the pattern created by the arrangement of the modules is highly symmetrical, so that a number of OPV elements, that is, a number of webs, can be arranged alongside each other so that the lengthwise direction of the web is essentially unrecognizable. A highly symmetrical pattern is defined, for example, by equilateral triangle modules, each containing three trapezoidal sub modules, the sub modules each containing a number of cells arranged alongside each other. By mirroring a module at one of the triangle sides, one of the trapezoidal sub modules is also mirrored in particular at its longer base side, so that this sub module and its mirror image form a hexagon. In particular, all base sides of the trapezoidal cells encompassed by this hexagon are parallel to each other.

Another benefit consists in that, thanks to the chosen pattern, a high geometrical fill factor is achieved and the dead region is slight. Thus, in particular, the power generated per area of the OPV element is improved.

Other features which are considered as characteristic for the invention are set forth in the appended claims.

Although the invention is illustrated and described herein as embodied in a organic photovoltaic element and a method for producing same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Corresponding parts are provided with the same reference numbers in all the figures.

Figure 1:
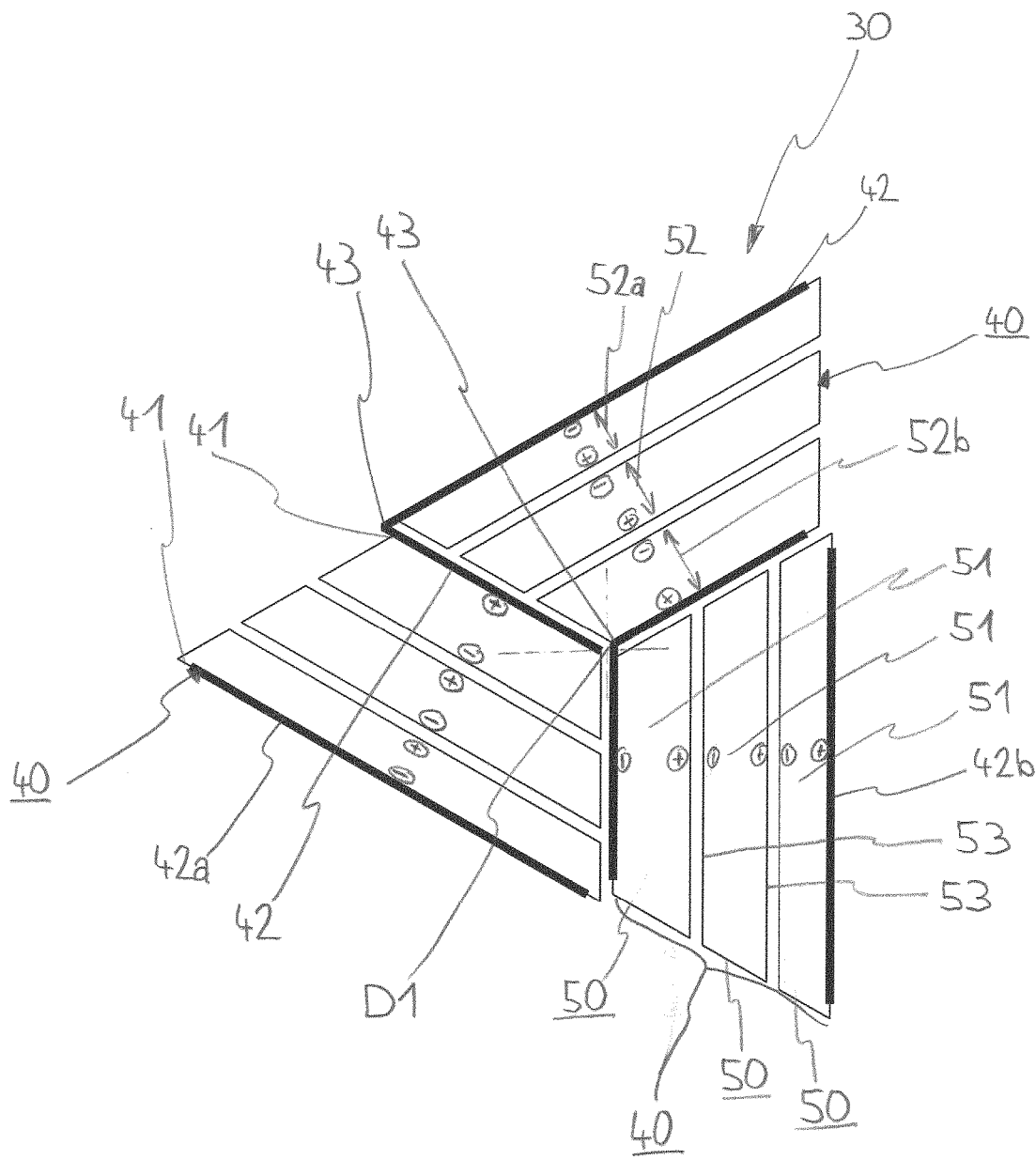
FIG. 1 is a schematic representation of a module of an OPV element according to the invention.

Referring now to the figures of the drawings in detail and first, particularly to FIG. 1 thereof, there is shown a schematic representation of a triangular module 30, containing three sub modules 40 each with three cells 50. The cells 50 of a sub module 40 are trapezoidal and connected in series, in each case being oriented in parallel to one another. The polarity of the individual cells 50 is indicated in each case in FIG. 1. From this, one notices that the individual cells 50 of each sub module 40 are interconnected in series and furthermore also connected in series to the additional cells 50 of the additional sub modules 40. The individual sub modules 40 of the module 30 are rotated with regard to each other, specifically each time by 120°.

The cells 50 each have photoactive surfaces 51. The surfaces 51 are defined by those regions having the photoactive organic semiconductor material free of interruption, having a characteristic coloration. In the intermediate regions between the individual cells 50, this semiconductor material is not present. The surfaces 51 are defined by a structuring during the manufacturing process. The mutual electrical switching of the individual cells 50 with each other occurs across the intermediate regions between the individual cells 50. The surfaces 51 of the cells 50 are roughly the same size, differing from each other preferably by less than 10%. In order to achieve this, a height 52 of the cells 40 of the sub module increases. Preferably, however, only such that neighboring cells 50 differ in their cell height 52 by less than 30%, the smallest and the largest cell height 52a, 52b differing in particular by no more than around 50%. Each sub module 40 is trapezoidal and has first base sides 41, which are oriented parallel to second base sides 53 of the cells 50 encompassed by it. The module 30 has threefold rotational symmetry in regard to a pivot point D1, given the arrangement of the cells 40.

Each sub module 40 has one pole 42 on each of the two base sides 41 for switching purposes. In all, the module 30 has six poles 42. The three sub modules 40 are interconnected in series. In order to interconnect the poles 42 of the three sub modules 40, additional connection electrodes 43 are provided. These interconnect every two neighboring sides of the trapezium, lying around a corner. Thus, the module 30 is a series circuit of nine cells 50, wherein one of the poles 42 is a minus pole 42a and another one of the poles 42 is a plus pole 42b, by which the module 30 can be connected to other modules.

Figure 2:
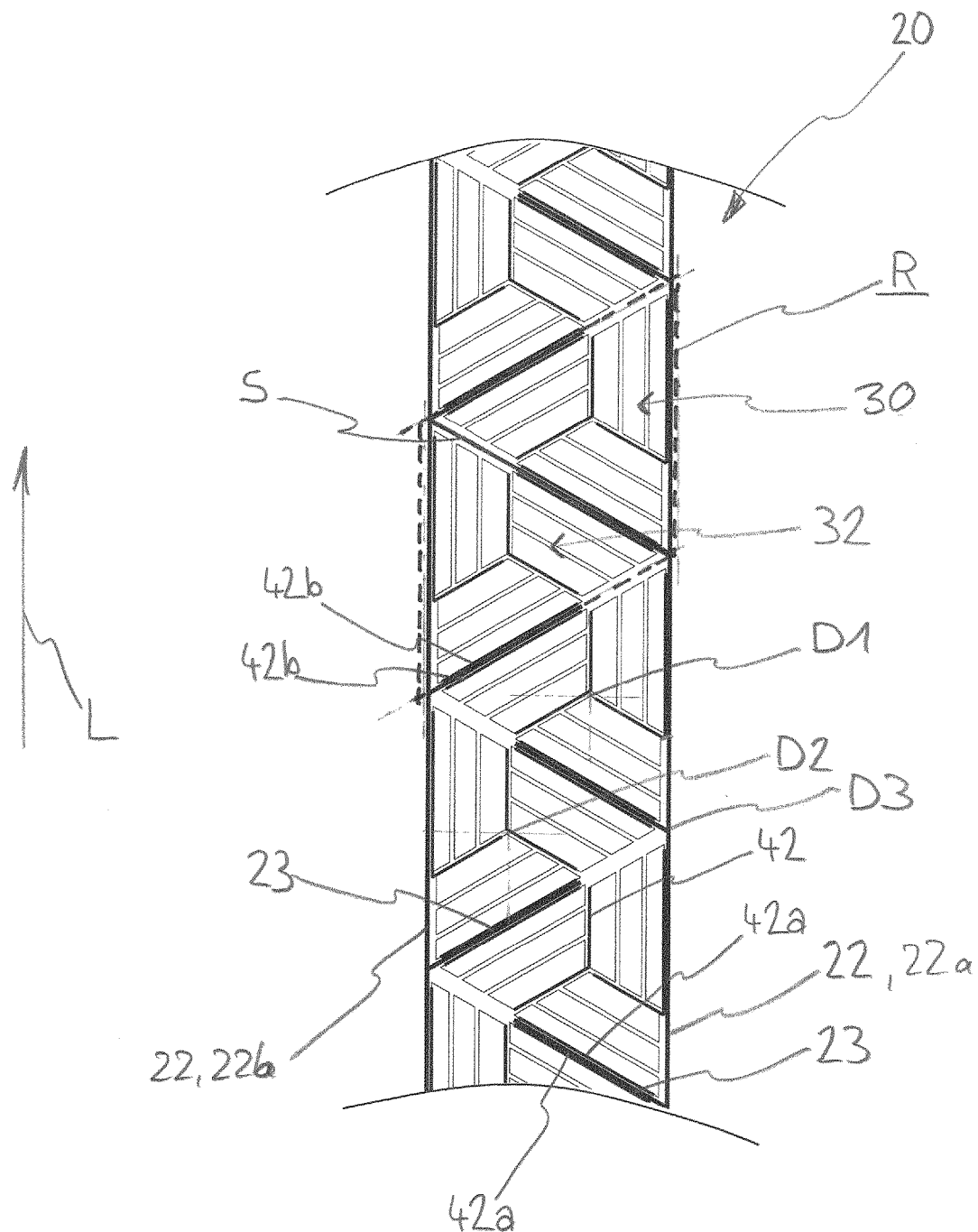
FIG. 2 is a schematic representation of a cutout of an OPV element with modules per FIG. 1.

FIG. 2 shows in schematic representation a sequence of first and second modules 30, 32 forming an OPV element 20 extending endlessly in a lengthwise direction L. The pattern formed by the cells 50 is periodic. The periodicity is defined by a rhombus R, which consists of a first module 30 per FIG. 1 and a second module 32, wherein the second module 32 is a mirror image of the first module 30 along one of the triangle sides S of the first module 30. One of the rhombi R is highlighted as an example by a broken line for better illustration. By arranging the two modules 30, 32 alongside each other, a threefold rotationally symmetrical pattern is formed with pivot points D1, D2, D3, in particular. By arranging the rhombi R alongside each other in the lengthwise direction L, a basic web of the OPV element 20 is created, which can be easily made by a roller pressing process. Several such basic webs can be arranged laterally alongside each other, depending on the width of the roller pressing device.

The basic web typically has a width in the range of a few centimeters, for instance, in the range of 5 to 15 cm. Thus, in the sample embodiment it corresponds to the (triangle) height of a respective module 30, 32. The individual cells 50, in turn, have a height, i.e. a distance between the two second base sides 53, lying roughly in the range of typically 0.5 cm to 2 cm.

Along the lengthwise direction L there extend at the edges 21 of the OPV element 20 two contact bars 22, which are joined by contact arms 23 to the poles 42. The contact bars 22 are fashioned as minus control bar 22a and plus contact bar 22b, being joined to the minus poles 42a and the plus poles 42b, respectively, of the particular modules 30, 32 across the contact arms 23. In the sample embodiment shown here, all cells 50 of each module 30, 32 are connected in series and the modules 30 are connected in parallel with the modules 32.

Figure 3:
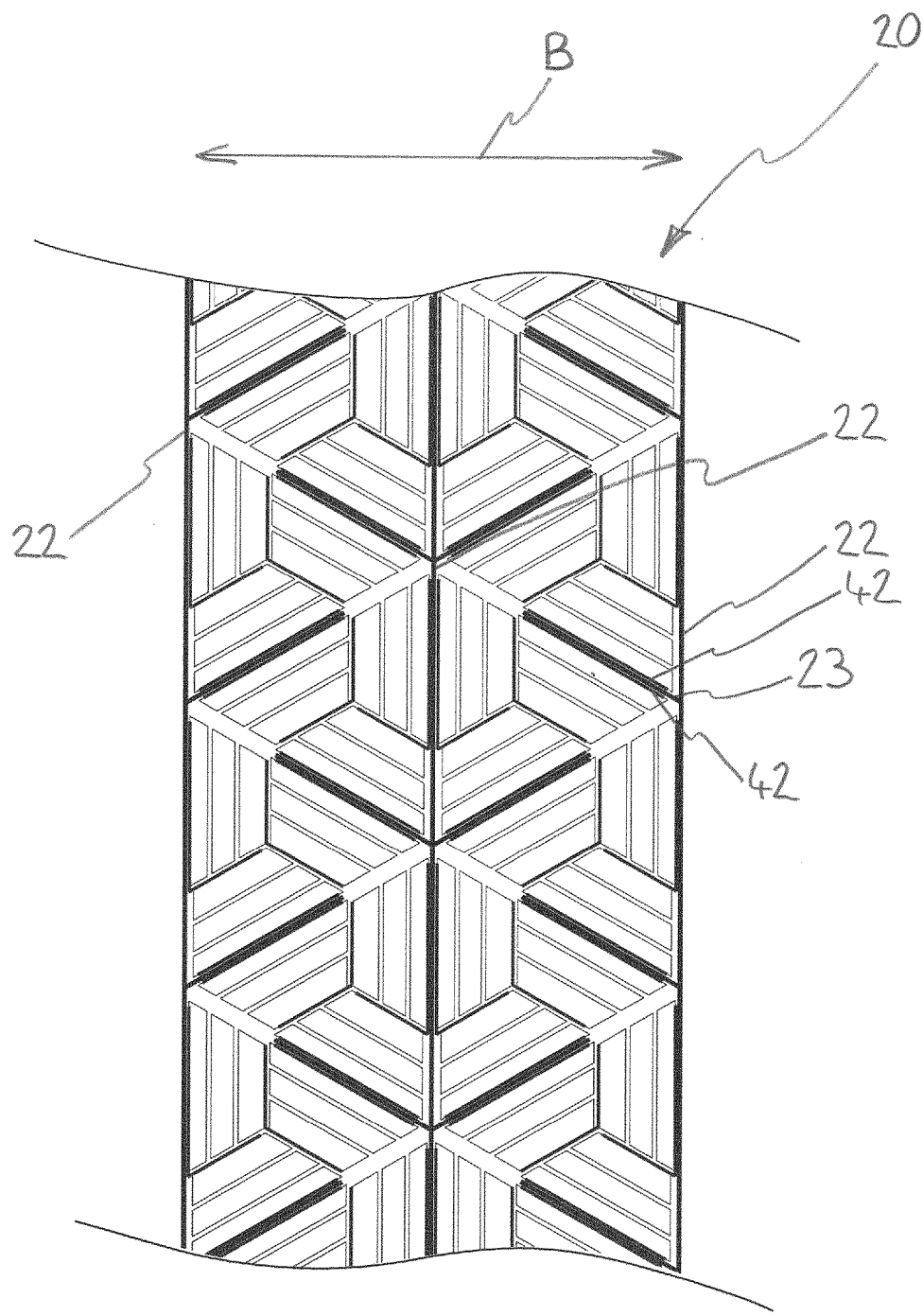
FIG. 3 is a schematic representation of a cutout of another OPV element with modules per FIG. 1.

FIG. 3 shows in schematic representation a cutout of an OPV element 20 similar to that shown in FIG. 2, wherein now two basic webs are arranged alongside each other. In this way, the OPV module has around twice the width B and also preferably three contact bars 22. In particular, consecutive contact bars 22 have different polarities, that is, the two outer contact bars 22 have the same polarity. This simplifies in particular the parallel connecting of several such OPV elements 20 to form an OPV panel 10.

Figure 4:
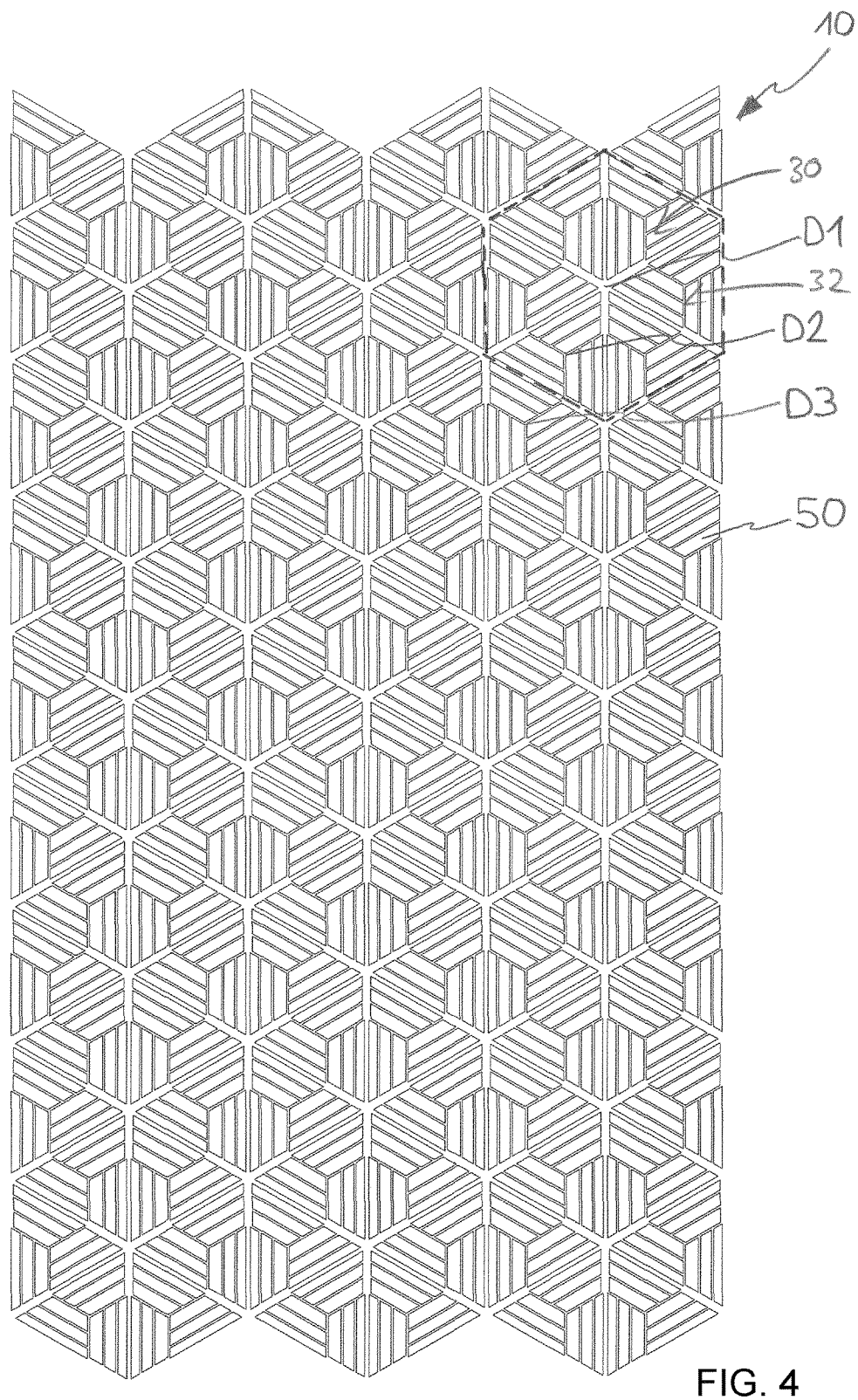
FIG. 4 is a schematic representation of a cell arrangement of an OPV panel made of several OPV elements per FIG. 3.

FIG. 4 shows in schematic representation the arrangement of the cells 50 of an OPV panel 10 formed from several OPV elements 20 per FIG. 4. The pattern formed by the cells 50 has threefold rotational symmetry, for example in regard to the pivot points D1, D2, D3. Thanks to the special configuration of the modules as equilateral triangles with the total of three identical trapezoidal sub modules 40 with the individual cells 50, the pattern formed in this way has a hexagonal overall structure. This creates overall on the one hand a very appealing design and on the other hand also allows assembling panels 10 with the most diverse surface configurations with no preferential direction. The hexagonal overall structure is in turn mirrored on the one hand in small hexagons, which are formed by two trapezoidal sub modules 40 bordering each other by their first base sides 41. On the other hand, the hexagonal overall structure is in turn mirrored in large hexagons, which are formed by six of the modules 30, 32, which are arranged for example about the pivot point D1. For illustration, this hexagonal arrangement of the modules 30, 32 is highlighted in FIG. 4 by a broken line.

On the whole, the threefold surface pattern represented in FIG. 4 is built up from the assembly of a plurality of endless basic webs represented in FIG. 2, resulting in each case from a periodic succession of the rhombi R, each rhombus R in turn formed from the two modules 30, 32.

Figure 5:
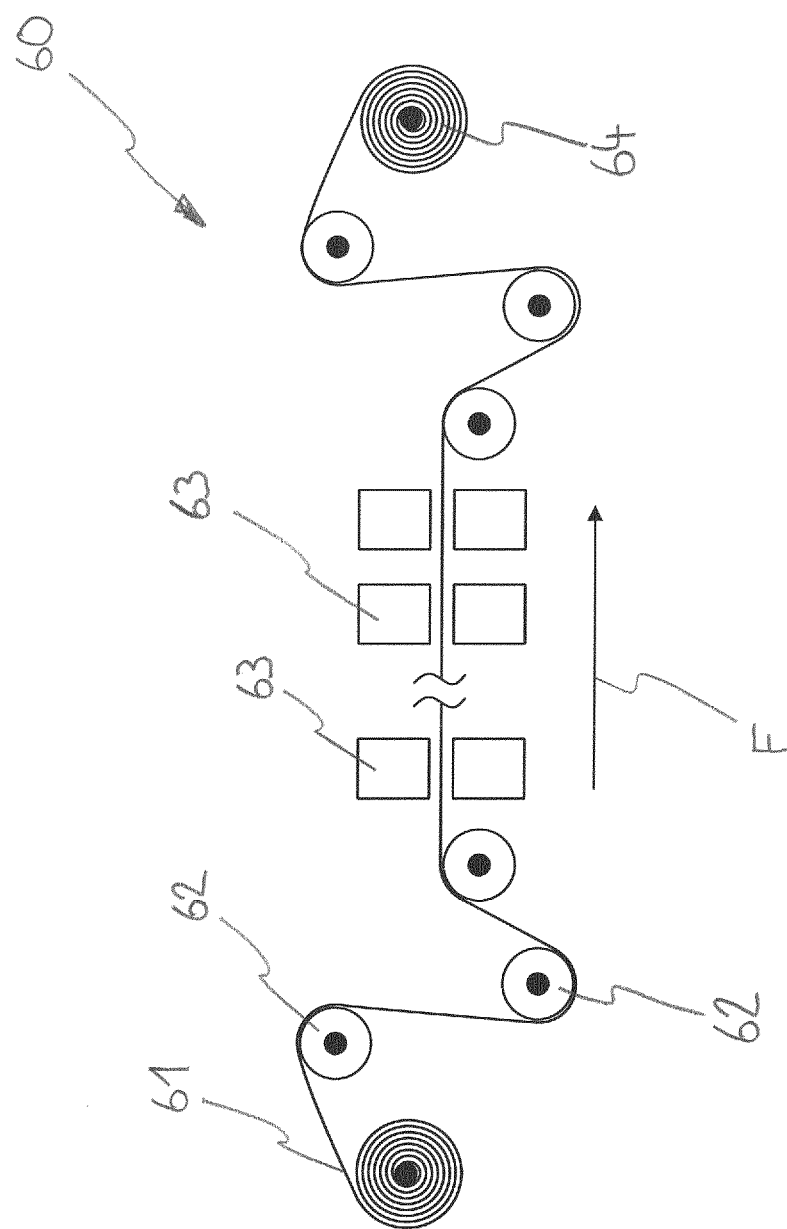
FIG. 5 is a schematic representation of a roller pressing process.

FIG. 5 shows in schematic representation a roller pressing machine 60 for the production of an OPV element 20 according to one of FIG. 2 or 3 by a roller pressing process. A substrate film 61 is provided in roll form and taken in the direction of conveyance F across a number of deflection rollers 62. The substrate film 61 is supported in the turn-around region by one side at the contact bars 22 against the deflection rollers 62. The direction of conveyance F is therefore equal to the lengthwise direction L. For this, the deflection rollers 62 are provided with peripheral contact rings, for example, rubber rings, against which the contact bars 22 are braced. In addition, the substrate film 61 is processed in familiar fashion in a number of process steps. The process steps are shown here schematically by consecutive stations 63 in the direction of conveyance F. Process steps include the applying of at least one functional layer, such as the semiconductor layer and at least one electrode material. After the processing, the processed substrate film 61, i.e., the OPV element 20 initially produced as an endless web, is rolled up into a roll 64.

From this, almost any desired panel surfaces can then be assembled by suitable arranging of the OPV elements 20 alongside each other and trimming to size thereof. Thus, a high degree of design freedom exists starting from the basic webs. Thanks to the special at least threefold pattern, especially with the hexagonal overall structure, a pleasing design is achieved overall with great design freedom of the surface. Thanks to the parallel connecting of the modules 30, 32, the OPV elements 20 can be cut to any desired length and elements 20 of different lengths can also be interconnected with no problem. Thanks to the special structuring into sub modules 40 and cells 50, each time having at least largely the same surfaces 51 and adapted cell heights 52, a high electrical photo efficiency is also furthermore achieved. Thanks to the form of the modules 30, 32, furthermore, a high geometrical fill factor and thus a high photo efficiency is achieved.

The following is a summary list of reference numerals and the corresponding structure used in the above description of the invention:
10 OPV panel
20 OPV element
22 contact bar
22a minus contact bar
22b plus contact bar
23 contact arm
30 module
32 module
40 sub module
41 first base side
42 pole
42a minus pole
42b plus pole
43 connection electrode
50 cell
51 surface
52 cell height
52a cell height
52b cell height
53 second base side
60 roller pressing machine
61 substrate film
62 deflection roller
63 station
64 roller
B width
D1 rotation point
D2 rotation point
D3 rotation point
F direction of conveyance
L lengthwise direction
R rhombus
S triangle side

The invention claimed is:

1. An organic photovoltaic (OPV) element, comprising:
    a plurality of modules extending in a lengthwise direction, each module of said plurality of modules having serially connected cells, each cell of said cells having a photoactive organic semiconductor material, a periodic succession of said modules defining a pattern and each module of said plurality of modules having threefold rotational symmetry;
    each module of said modules having sub modules and connection electrodes, said sub modules being interconnected by said connection electrodes, and each sub module of said sub modules containing said cells;
    each sub module of said sub modules being trapezoidal shaped and containing two first base sides; and
    each cell of said cells being trapezoidal shaped and having two second base sides, each second base side of said two second base sides in one of said cells being parallel to said two first base sides of one of said sub modules containing said one of said cells.

2. The OPV element according to claim 1, wherein the each module of said plurality of modules is polygonal shaped.

3. The OPV element according to claim 1, wherein the each module of said plurality of modules is triangularly shaped.

4. The OPV element according to claim 3, wherein a periodicity of said pattern is defined by a rhombus formed by two of said modules with a common triangle side and said rhombus has mirror symmetry along said common triangle side in regard to said serially connected cells.

5. The OPV element according to claim 1, wherein the each of said serially connected cells defines a surface and surfaces of different ones of said serially connected cells differ from each other by less than 10% in size.

6. The OPV element according to claim 1, wherein the each of said serially connected cells has a cell height and cell heights of different ones of said serially connected cells differ from each other by less than 100%.

7. The OPV element according to claim 1, wherein the OPV element is formed as a web extending in the lengthwise direction with contact bars extending in the lengthwise direction.

8. The OPV element according to claim 7, wherein the each of said plurality of modules has a minus pole and a plus pole and said contact bars electrically connect either minus poles or plus poles.

9. The OPV element according to claim 1, wherein all of said plurality of modules are connected in parallel.

10. The OPV element according to claim 1, further comprising a layered structure and a substrate film, said layered structure being formed by means of a roller pressing process.

11. The OPV element according to claim 1, wherein the each of said plurality of cells has a cell height and cell heights of different ones of said serially connected cells differ from each other by less than 30%.

12. An organic photovoltaic (OPV) panel, comprising:
    each of a plurality of organic photovoltaic (OPV) elements having a plurality of modules extending in a lengthwise direction, each of said plurality of modules having serially connected cells, each of said serially connected cells having a photoactive organic semiconductor material, and a periodic succession of said plurality of modules defines a pattern wherein the each of said plurality of modules having threefold rotational symmetry, said plurality of OPV elements being disposed alongside one another and being oriented in parallel with each other in regard to said lengthwise direction;
    the each of said plurality of modules having sub modules and connection electrodes, said sub modules being interconnected by said connection electrodes, and the each of said sub modules containing said serially connected cells;
    the each of said sub modules being trapezoidal shaped and containing two first base sides; and
    the each of said serially connected cells being trapezoidal shaped and having two second base sides, each of said two second base sides in one of said serially connected cells being parallel to said first base sides of one of said sub modules containing the one of said serially connected cells.

13. A method for producing an organic photovoltaic (OPV) element having a plurality of modules extending in a lengthwise direction, each of the plurality of modules having serially connected cells, each of the serially connected cells having a photoactive organic semiconductor material, and a periodic succession of the plurality of modules defining a pattern wherein the each of the plurality of modules having threefold rotational symmetry, which comprises the steps of:

producing the organic photovoltaic (OPV) element by means of a roller pressing process or a roller application process;
producing the each of the plurality of modules to have sub modules and connection electrodes, the sub modules being interconnected by the connection electrodes, and the each of the sub modules containing the serially connected cells;
producing the each of the sub modules to be trapezoidal shaped and to contain two first base sides; and
producing the each of the serially connected cells to be trapezoidal shaped and to have two second base sides, each of the two second base sides in one of the serially connected cells being parallel to the first base sides of one of the sub modules containing the one of the serially connected cells.

* * * * *